United States Patent [19]

Ukita et al.

[11] Patent Number: 4,860,276
[45] Date of Patent: Aug. 22, 1989

[54] MICRO OPTICAL HEAD WITH AN OPTICALLY SWITCHED LASER DIODE

[75] Inventors: Hiroo Ukita; Yoshitada Katagiri, both of Tokyo; Renshi Sawada; Yuuji Uenishi, both of Saitama; Yoshihiro Isomura, Tokyo; Tomoyuki Toshima; Keisuke Mise, both of Saitama, all of Japan

[73] Assignee: Nippon Telegraph and Telephone Corporation, Tokyo, Japan

[21] Appl. No.: 97,560

[22] Filed: Sep. 16, 1987

[30] Foreign Application Priority Data

Sep. 18, 1986 [JP] Japan .................................. 61-218097
Feb. 26, 1987 [JP] Japan .................................. 62-41509
Mar. 14, 1987 [JP] Japan .................................. 62-59699
Mar. 16, 1987 [JP] Japan .................................. 62-59016
Jun. 5, 1987 [JP] Japan .................................. 62-140104

[51] Int. Cl.$^4$ .................................................. G11B 7/00
[52] U.S. Cl. .................................... 369/119; 369/121; 369/58; 346/76 L
[58] Field of Search ................ 358/342; 369/43–47, 369/112, 121, 116, 54, 58; 250/201 DF; 346/76 L, 135.1

[56] References Cited

U.S. PATENT DOCUMENTS 4,451,915 5/1984 La Budde et al. ............ 346/135.1 X
4,456,914 6/1984 Winslow ........................ 369/116 X
4,538,257 8/1985 Klinger .......................... 369/116 X

FOREIGN PATENT DOCUMENTS 56-137533 10/1981 Japan .
57-133531 8/1982 Japan .

Primary Examiner—Robert L. Richardson
Attorney, Agent, or Firm—Armstrong, Nikaido, Marmelstein, Kubovcik & Murray

[57] ABSTRACT

A micro optical head, for optically reading and/or writing digital data on a recording medium in which digital data 1 and 0, corresponding to a high reflection factor and a low reflection factor, is composed of a self-coupled semiconductor laser located close to the recording medium. A bias current of the laser is determined so that it is smaller than a first threshold current, in which the medium has a low reflection factor, and is higher than a second threshold current, in which the medium has a high reflection factor. Output light of the laser is either strong stimulated emission light, corresponding to the high reflection factor, or weak spontaneous emission light, corresponding to the low reflection factor. The present head is carried on a flying slider with a spacing length less than several μm which provides a small beam spot of about 1 μm, and has an excellent signal to noise ratio. A photodetector for sensing the output of the laser may be carried on the same semiconductor substrate as that of the laser.

10 Claims, 19 Drawing Sheets

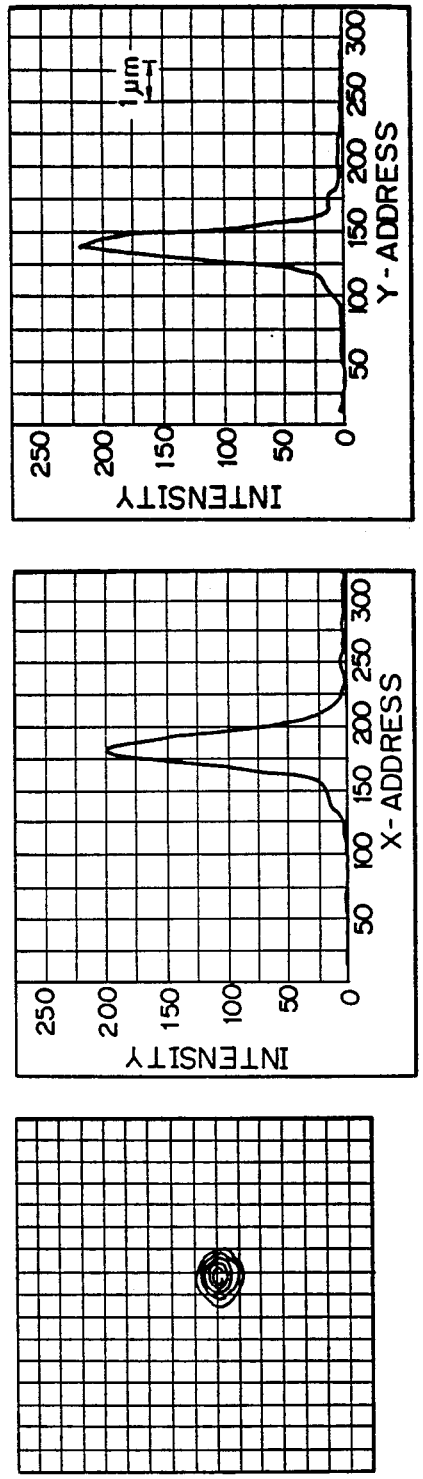

MICRO OPTICAL HEAD WITH AN OPTICALLY SWITCHED LASER DIODE

FIELD OF THE INVENTION

The present invention relates to an optical head for reading and/or writing digital data on a recording medium, in particular, relates to an optical head which uses a self-coupled semiconductor laser.

The present optical head is used as a read head and/or a write head and/or an erase head on a recording medium which stores digital data 0 or 1, which depends upon a high or a low reflection factor of the recording medium. The present optical head is used in an optical disk device which stores, not only picture signals, but also digital data for information processing.

BACKGROUND OF THE INVENTION

A prior optical laser using a self coupled semiconductor laser is shown in the Japanese patent laid open publications 133531/82 and 137533/81, in which a semiconductor laser is fed abias current larger than a threshold current, for stimulating the laser, and an output light is focused on a recording medium through a focusing lens. The output light of the laser illuminates the recording medium through the focusing lens, and the feedback beam, reflected by the recording medium, returns to the laser. As the intensity of the output light of the laser depends upon the feedback light, or the reflection factor of the recording medium, the data 0 or 1, stored on the recording medium, is sensed by the intensity of the output light of the laser.

However, a prior self-coupled semiconductor laser optical head has the following disadvantages:

First, a prior optical head is biased larger than the threshold current which stimulates the laser. Thus, the prior laser continuously outputs a strong stimulated emission light. When a pit with a small reflection factor is sensed, the bias current must be close to the threshold current. However, since the laser generates a lot of noise when the bias current is close to the threshold current, if the noise is decreased by increasing the bias current, the output beam will be too strong, and will destroy the data stored on the recording medium.

Secondly, a prior self coupled semiconductor laser optical head has the disadvantage that it is heavy, since it must have a focusing lens. The total weight of the prior optical head is about 60 gr. The recording density and/or the operation speed of an optical disk device using a prior optical head is unfavorably limited.

SUMMARY OF THE INVENTION

It is an object, therefore, of the present invention to overcome the disadvantages and limitations of the prior optical head by providing a new and improved optical head.

It is also an object of the present invention to provide an optical head, which provides a small beam spot with an excellent signal to noise ratio.

It is also an object of the present invention to provide an optical head, which is light in weight. The present optical head may even be 1 gr in weight.

The above objects are attained by an optical head having a semiconductor laser having a first output end facing an optical recording medium and a second output end facing an optical detector which detects the output intensity of the semiconductor laser. The output intensity of the semiconductor laser depends upon feedback light which is generated by the semiconductor laser and which is reflected by the optical recording medium. The semiconductor laser is biased so that a bias current of the semiconductor laser is lower than a first threshold current which, stimulates the semiconductor laser to illuminate the recording medium on a first portion which has a first low reflection factor. The bias current is also higher than a second threshold current which stimulates the semiconductor laser to illuminate the recording medium on a second portion which has a higher reflection factor than that of the first portion.

BRIEF DESCRIPTION OF THE DRAWINGS

The foregoing and other objects, features, and attendant advantages of the present invention will be appreciated by means of the following description and accompanying drawings wherein.

DESCRIPTION OF THE PREFERRED EMBODIMENTS

Figure 1:
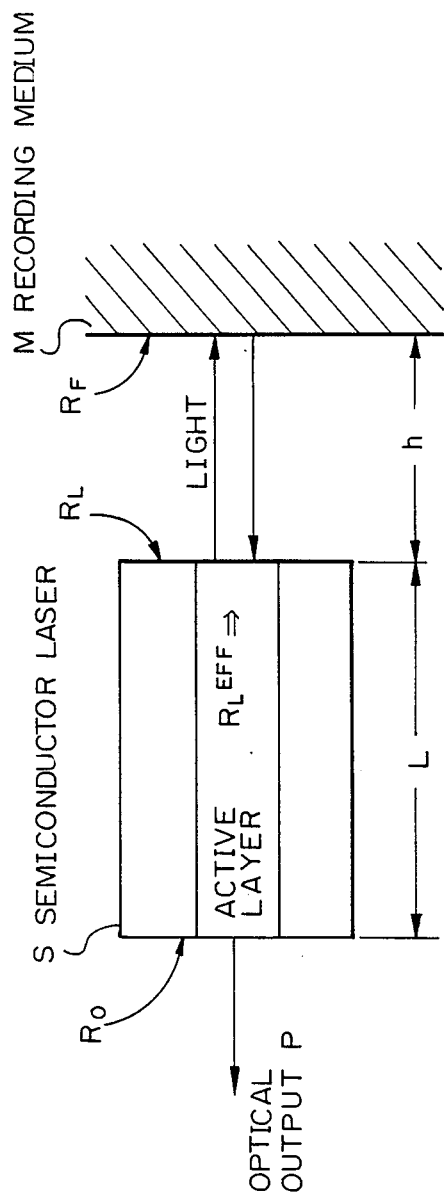
FIG. 1 shows the basic structure of the optical head according to the present invention.
Figure 2:
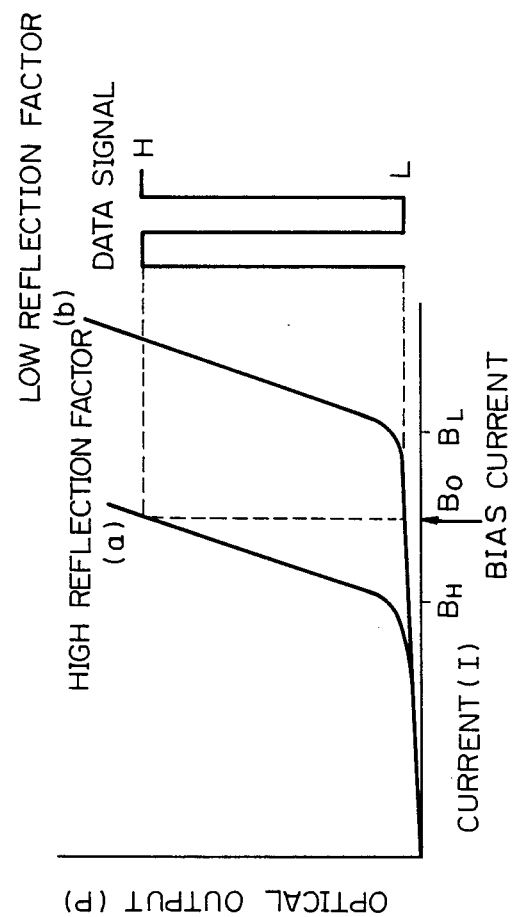
FIG. 2 shows the operational principle of the optical head according to the present invention.

First, the basic idea of the present invention is described in accordance with FIGS. 1 through 3.

FIG. 1 shows the basic structure of the optical head according to the present invention, in which a recording medium M is located close to one end of a semiconductor laser S with a predetermined spacing h therebetween. The semiconductor laser S itself is conventional, and has a pair of clad layers, and an active layer sandwiched between the clad layers, together with a pair of opposite reflection surfaces $R_0$ and $R_L$. When a semiconductor laser is biased in a direction to a value higher than a threshold value, stimulated emission light is obtained in both the directions of the laser. One light from the laser is directed to the recording medium, and the other is directed to a PIN diode (not shown) on a right side of the drawing for detection.

The threshold value of the bias current for stimulated emission decreases when feedback light exists or when the reflection coefficient of the recording medium M is high, if the internal mode in the semiconductor laser matches the external mode between the reflection surface of the recording medium and the reflection end of the laser.

FIG. 2 shows the relationship between the bias current (I) and the optical, output (P), in which curve (a) shows the case when the reflection factor on the surface of the recording medium is high, and curve (b) shows the when the reflection factor is low.

According to the present invention, the bias current $B_0$ for the semiconductor laser is determined to be between $B_L$ and $B_H$, where $B_L$ is the threshold bias current when the reflection factor of the recording medium is low, and $B_H$ is the threshold bias current when the reflection factor of the recording medium is high.

The semiconductor laser then operates so that it generates high stimulated emission light when the reflection factor of the recording medium is high, and generates low spontaneous emission light when the reflection factor of the recording medium is low. Thus, the reflection factor of the recording medium, which carries digital data recorded on a recording medium, is measured by the strength of the optical output of the semiconductor laser. The optical output of the semiconductor laser is measured by a PIN diode (not shown) located on an opposite side of the semiconductor base to the recording medium. Of course, the output of the PIN diode shows the digital data signal (H, L) relating to the recorded data on the recording medium.

The optical output of a semiconductor laser is analyzed by using a rate equation which includes the relationship between electron density N and photon density S. The rate equation for the device in FIG. 1 in a steady state for electron density and photon density is as follows.

$$J - N - NS = 0 \quad (1)$$

$$S(N - 1 + \epsilon) + CN = \quad (2)$$

where ($\epsilon$) is the ratio of feedback light which couples with a photon in an active layer in a laser (coupling coefficient), J is the current density, and C is the spontaneous emission light coefficient. It is assumed in equations (1) and (2) that the current density, the electron density and the photon density are uniform in the active layer, and that the laser operates with a single mode oscillation. They are normalized by the threshold values of an isolated laser.

Figure 3A:
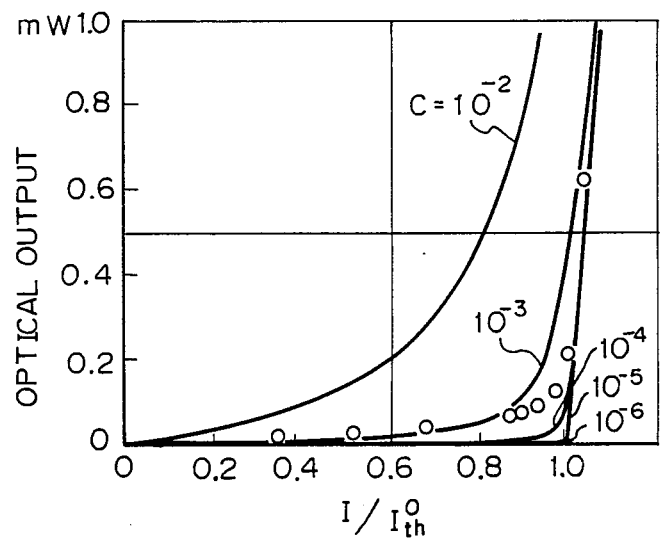
FIGS. 3A and 3B show curves of current versus optical output of the optical head according to the present invention.
Figure 3B:
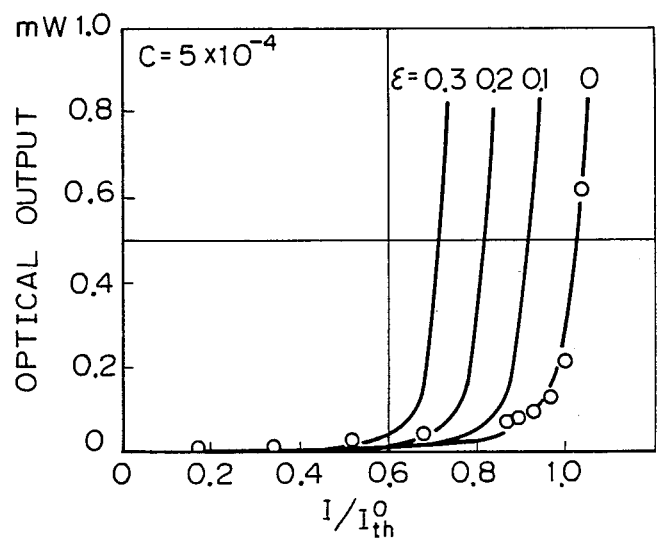

FIGS. 3A and 3B show the calculated relationship between the bias current $I/_{th}^0$ and the optical output, where the bias current I is normalized by the threshold current $I_{th}^0$ with no feedback light. The solid lines in FIGS. 3A and 3B show the calculated results, and the circles show the experimental results using a channel stripe planar laser (no feedback light, and ($\epsilon$)=0). FIG. 3A shows the experimental results and the calculated curves of the spontaneous emission light coefficient C, and FIG. 3B shows that the value C is $5 \times 10^{-4}$ FIG. 3B shows the relationship between the bias current and the optical output, using the above value $C(=5 \times 10^{-4})$ for each value of ($\epsilon$).

The operation of the optical head of FIG. 1 is analyzed by evaluating the value ($\epsilon$) for each of the operational conditions including; a gap spacing between the laser and the recording medium, the reflection factor of the recording medium, and/or the reflection factor of the laser end surface.

The effective reflection factor $R_L^{EFF}$ a direction to the right of the laser in FIG. 1 is shown by equation (3) which neglects the phase term by a gap spacing.

$$R_L^{EFF} = R_L[1 + (1 - R_L)^2 R_F \mu / R_L] \quad (3)$$

where $R_L$ is the reflection factor of the end surface of the laser, $R_F$ is the reflection factor of the recording medium, and ($\mu$) is the optical transmission factor which depends upon the beam divergence angle of the feedback light and is determined by the numerical design (thickness of an active layer, width of a stripe, and/or length of a gap spacing et al) of the laser.

The coupling coefficient ($\epsilon$) is expressed in equation (4), by using the $R_L^{EFF}$.

$$(\epsilon) = 1 - I_{th}/I_{th}^0 = ln(R_L^{EFF}/R_L)/[2\alpha L - ln(R_0 R_L)] \quad (4)$$

where $I_{th}$ is the threshold value for stimulation with feedback light, $I_{th}^0$ is the threshold value for stimulation with no feedback light, ($\alpha$) is the absorption factor, L is the resonance length of a semiconductor laser, and $R_0$ is the reflection factor on the end of the laser which is opposite from the recording medium.

Figure 4A:
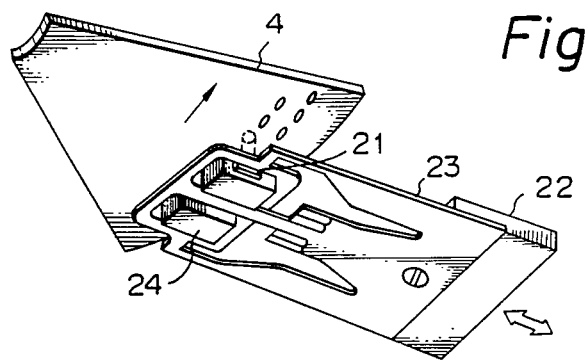
FIGS. 4A through 4D show the structure of the optical head according to the present invention.

FIG. 4A shows the embodiment of the present optical head assembly. The optical head 21 operates as a so-called flying head in which the head 21 is not in contact with the optical recording medium 4, but the head 21 is positioned close to the medium with a small gap therebetween. The head 21 (laser) together with a photodetector (PD) are mounted on the side wall of the slider 24 (see FIG. 4D) coupled with the load spring 23, which is carried on the arm 22 which is movable in the radius direction of the medium 4. The gap length (h) between the head 21 and the recording medium 4 is determined by the load of the load spring 23, the shape and the weight of the slider 24, and the moving velocity of the recording medium 4.

Figure 4B:
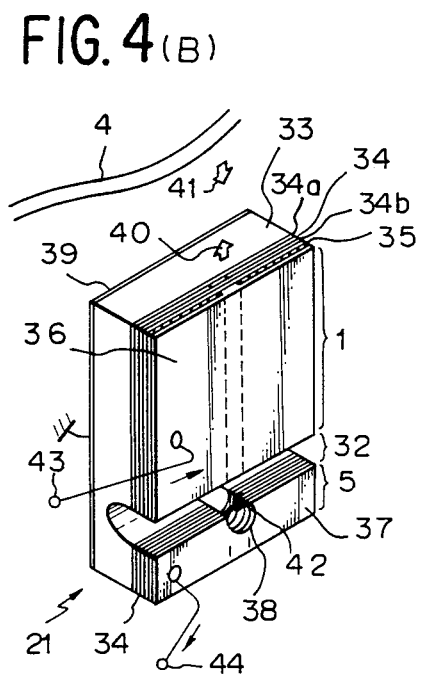

FIG. 4B shows the structure of the optical head 21 according to the present invention, in which the numeral 33 is a semiconductor substrate, 34 is an active layer which is sandwiched by a pair of clad layers 34a and 34b, 35 is an insulation layer, 36 is a semiconductor laser electrode, 37 is a photodetector electrode, 38 is a photodetector portion, 39 is a common electrode common to both the laser portion and the photodetector portion. The dotted line in FIG. 4B shows a current concentration electrode, which is a part of the electrode 36 and is defined by the insulation layer 35. The current concentration electrode has a width of about several μm.

The head 21 is separated into a semiconductor laser portion 1, and a photodetector portion 5, by a separation slit 32, which is several μm in width and depth.

The semiconductor laser portion 1 is biased in a forward direction between the electrodes 36 and 39 through the lead line 43. The light 40 emitted by the laser 1 is reflected by the recording medium 4, and the reflected light 41 returns to the semiconductor laser 1, as feedback light.

The optical output 42 of the semiconductor laser 1 depends upon the surface reflection factor of the recording medium 4, or the information (0 or 1) stored on the recording medium 4. That is to say, when the reflection factor of the recording medium 4 is high, the optical output 42 is strong stimulated emission light. When the reflection factor is low, the optical output 42 is weak spontaneous emission light. The optical output of the laser 1 is received by the photo portion 38, which provides either a high level data signal H or a low level data signal L depending upon the data stored on the medium, as shown in FIG. 2.

Figure 4C:
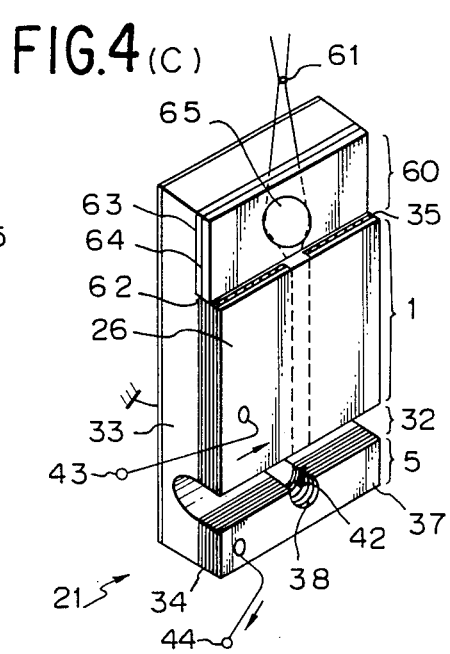
Figure 4D:
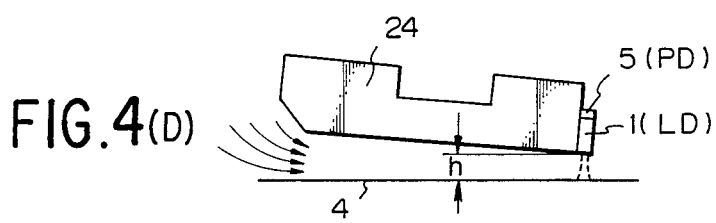

FIG. 4C shows a modification of the structure of FIG. 4B. The feature of FIG. 4C is the presence of a waveguide lens portion 60 located on a front end of the laser 1 on the same substrate 33 of the laser so that the beam spot 61 is focused on the recording medium, and the recording density is increased. In FIG. 4C, numeral 62 is an etched mirror surface which contacts with a buffer layer 63 (made of $SiO_2$), and a waveguide layer 64 (made of 7059 glass). The numeral 65 is a Luneburg lens made of dielectric material (for instance SiN) having a higher refractive index than that of the waveguide layer 64. The external profile of the lens 64 is circular, and the surface is in the shape of a half of a sphere. The operation of FIG. 4C is the same as that of FIG. 4B, except for the focussing operation by the lens 60.

It is advantageous that the laser end surface, which faces with the recording medium, is coated with an anti-reflection film so that $R_L$ in the equation (4) is decreased, and the coupling factor ($\epsilon$) is increased. Then, the feedback ratio of the spontaneous emission light increases, and the laser oscillation is easily triggered.

Next, the noise of the present optical head is analyzed. The effective value $N_{rms}(mV)$ of noise of an optical head is expressed as follows, by using the frequency characteristics N(f).

$$N_{rms} = \sqrt{\int_{f1}^{f2} N^2(f)df/(f2-f1)} \qquad (5)$$

where f1 is 30 kHz, f2 is 20 MHz, and the resolving power is 10 kHz. The relationship between $N_{rms}$, an injection current, a reflection factor of a recording medium and a gap spacing are analyzed below.

Figure 5:
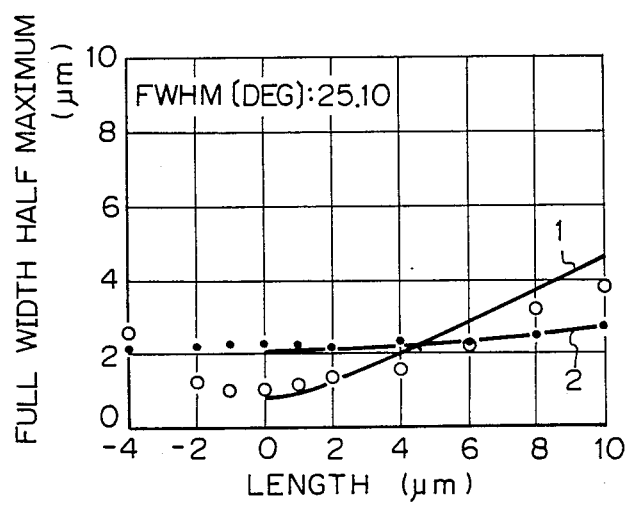
FIG. 5 shows the spot size by the optical head according to the present invention.

FIG. 5 shows the experimental results of the spot size of FIG. 4B. The horizontal axis in the FIG. 5 shows the length (μm) from the front output end of the laser, and the vertical axis shows the diameter of the beam spot (μm). FIG. 5 shows the half value diameter. The white circles show the experimental values along the vertical direction to the active layer, and the black circles show the experimental results in the horizontal direction to the active layer. FWHM means Full Width Half Maximum. The calculated curve (1) shows a beam divergence angle of 25°, and the calculated curve (2) shows beam divergence angle of 10°.

Figure 6:
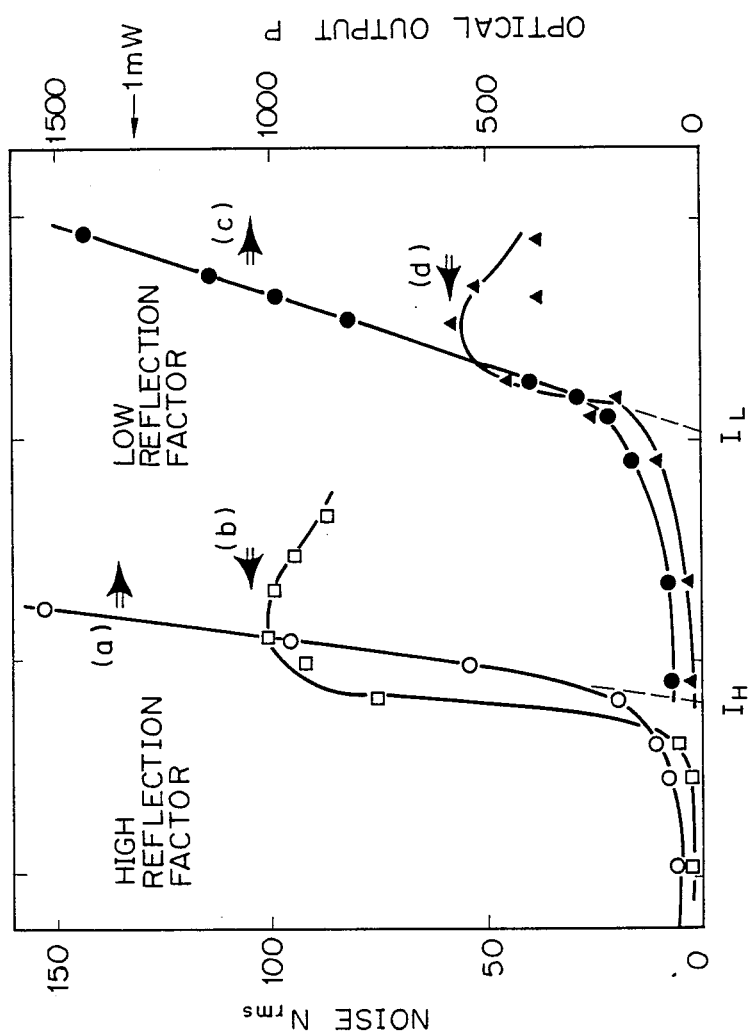
FIG. 6 shows the curves of current versus noise in the optical head according to the present invention.

FIG. 6 shows curves of the current versus $N_{rms}$ ((b) and (c)), together with the I-L (current-optical output) characteristics ((a) and (d)). The curves (a) and (b) show a high reflection factor, and the curves (c) and (d) show a low reflection factor.

It should be noted in FIG. 6 that the effective noise $N_{rms}$ increases with the optical output, until the bias current reaches the threshold value ($I_H$ or $I_L$), and the noise decreases when the bias current exceeds the threshold value. The peak value of $N_{rms}$ with the feedback light is twice as large as that with no feedback light.

Figure 7:
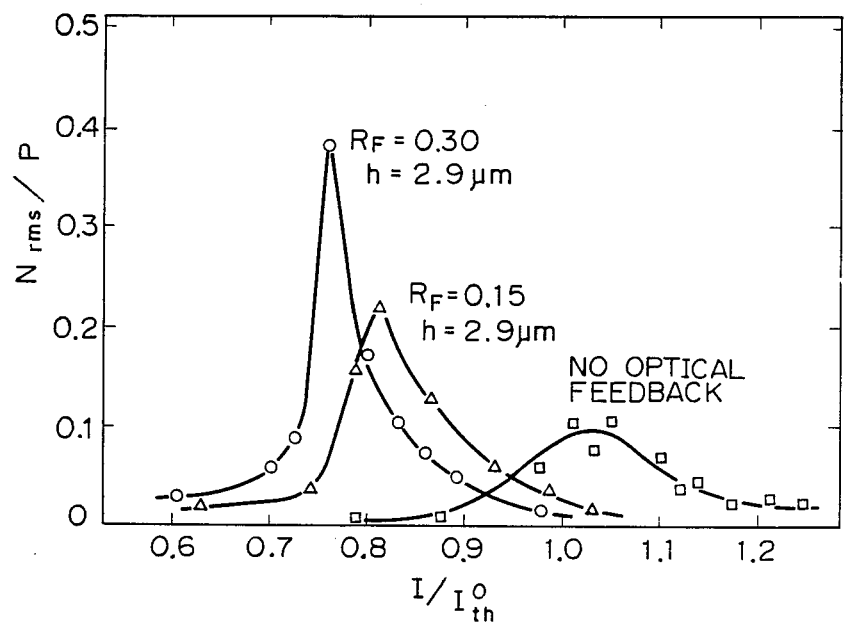
FIG. 7 shows curves of current versus noise with the parameter of the reflection factor of the recording medium.

FIG. 7 shows the relationship between the bias current and the value $N_{rms}/P$ with the parameter of the reflection factor $R_F$ of a recording medium, where h is the spacing between a laser and a recording medium. It is understood in FIG. 6 that when the reflection factor of the recording medium is high, the peak value of $N_{rms}/P$ is high and the width of that curve is narrow.

Figure 8:
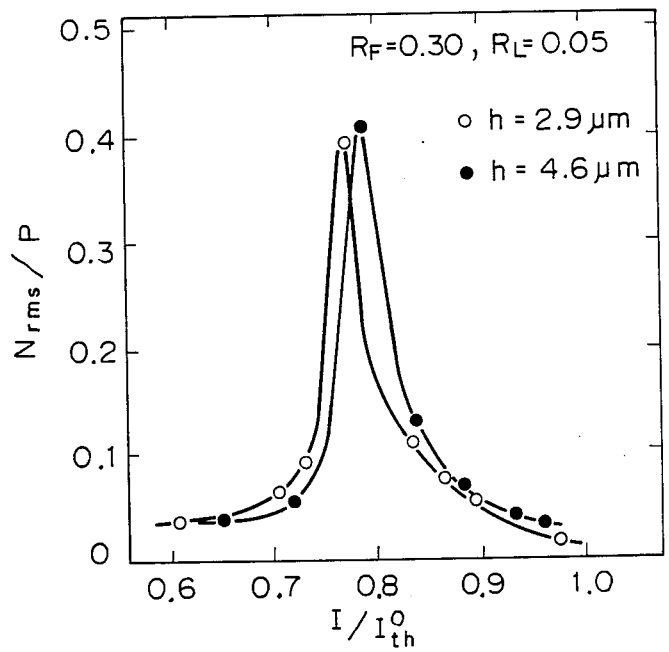
FIG. 8 shows the curves of current versus and noise with the parameter of a spacing length h.

FIG. 8 shows the relationship between the bias current and the normalized noise $N_{rms}/P$, where P is the optical output, with the parameter of a gap spacing length. It is understood in FIG. 8 that when the gap length h is small, the $N_{rms}/P$ curve shifts toward the right of the Figure (small current direction). The bias current for providing the maximum value of $N_{rms}/P$ is approximately 1.02 times the threshold current.

Accordingly, it is concluded as apparant from the above curves (in particular FIG. 5) that the bias current of a laser should be set to the spontaneous emission region ($I<I_L$) for a low reflection factor portion of the recording medium, and simultaneously to the stimulated emission region ($I>I_H$) for a high reflection factor portion of the recording medium where laser noise is low, so that data a output signal with excellent quality is obtained.

The data signal SN ratio defined by the following equation is introduced to provide the optimum operation condition.

$$SNR = 20 \log_{10} S_{pp}/N_{rms} \qquad (6)$$

where $S_{pp}$ is the amplitude of data signal, and is defined as follows.

$$S_{pp} = P^H - P^L \qquad (7)$$

where $P^H$ and $P^L$ are light outputs at a high reflection factor portion and a low reflection factor portion, respectively.

Figure 9:
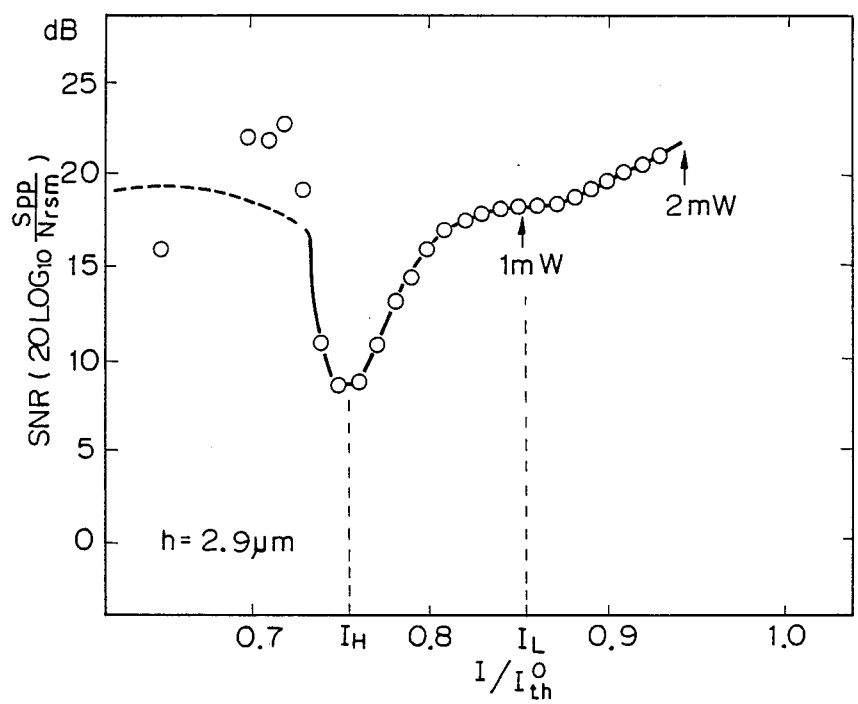
FIG. 9 shows the curve of current versus SNR.

FIG. 9 shows the relationship between the bias current and SNR, in which it is understood that the SNR is a minimum when the bias current is $I_H$(FIG. 5 and FIG. 8) which gives the maximum noise, and when the bias current increases higher than $I_H$, the value SNR increases. However, it should be appreciated that the maximum allowable current is restricted to a level where the recorded data is not destroyed by the illumination of the optical beam. The effect by $I_L$ (threshold current for a low reflection factor) is observed as shown in FIG. 8.

Next, the modulation index M is defined as follows in order to evaluate the data signal waveform for each injection current.

$$M = (P^H - P^L)/(P^H + P^L) \quad (8)$$

Figure 10:
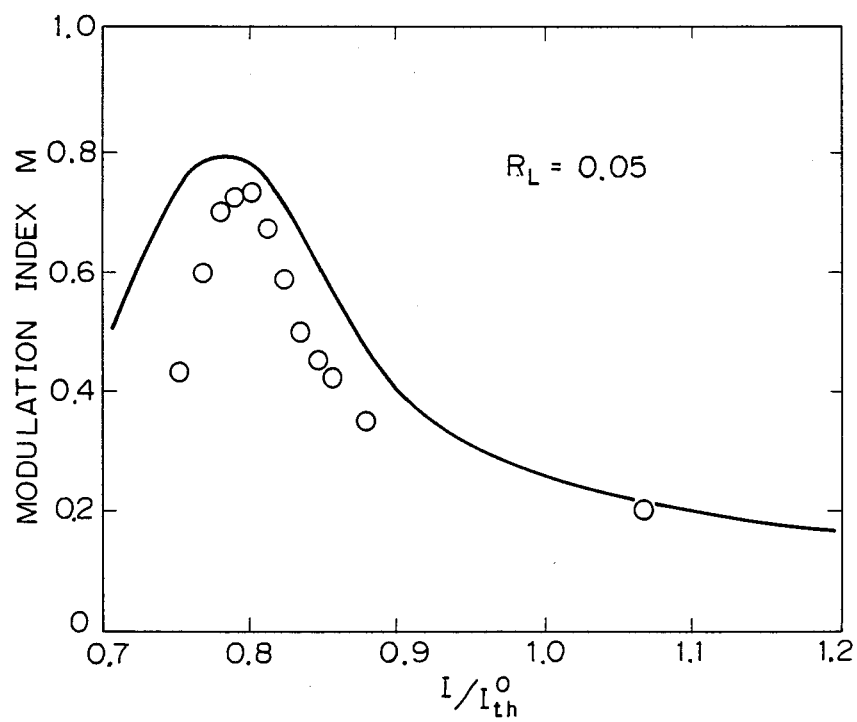
FIG. 10 shows the curve of between current versus modulation index.

FIG. 10 shows a curve of the bias current versus the modulation index M where $R_F$ is 0.30 and 0.15 for data 1 and data 0, respectively. The reflectivity of the laser facet $R_L$ is 0.05. The horizontal axis in FIG. 10 shows the bias current, which is normalized by the threshold current $I_{th}^0$, with no feedback light. The circles in FIG. 9 show the experimental values, and the solid line shows the theoretical curve using the rate equation, considering the coupling efficiency of the feedback light.

It is understood in FIG. 10 that the current $I_p$ which gives the maximum modulation index satisfies the following equation;

$$I_H < I_p < I_L$$

It should be noted that the current $I_p$ which satisfies the above equation coincides with the bias current in FIG. 9 when the optical output is 1 mW.

Next, the dependency of the optical output upon the gap spacing length h is described. Since the beam reflected by the recording medium interfers with the original inner light which illuminates the recording medium, the gap spacing length h must be designed properly.

Figure 11A:
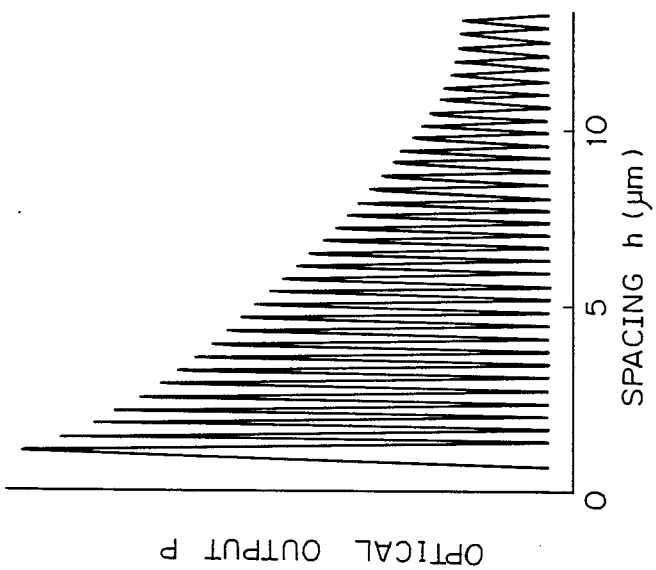
FIGS. 11A and 11B show the relation between the spacing length h and the optical output P.

FIG. 11A shows the relationship between the gap spacing length, between the end of the optical head and the surface of the recording medium (horizontal axis in μm), and the optical output P.

It is understood in FIG. 11A that the optical output P decreases rapidly as the gap spacing length h increases, and that the optical output P changes with the period $\lambda/2$ (where $\lambda$ is the wavelength, and it is assumed that the refractive index is n=1 in the area between the optical head and the recording medium).

Therefore, it is desirable that the gap spacing length h is selected so that the maximum peak optical output P is obtained, and the feedback light is in phase with the inner light in the laser. The desirable length h has a period of $\lambda/2$.

Figure 11B:
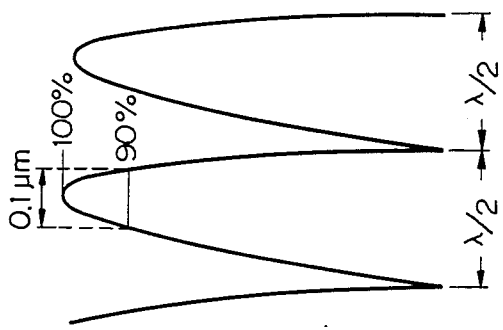

FIG. 11B is the enlarged view of a part of FIG. 11A, and shows the effect of an error in the gap spacing length h. As shown in FIG. 11B, when the value h has an error of 0.1 μm, the optical output P decreases by 10% ($\lambda=830$ nm). It should be noted that a error within 0.1 μm of the length h is allowable.

As mentioned before, the gap spacing length h is defined by the structure of the slider, the load spring, and/or the running speed of the recording medium.

Figure 12A:
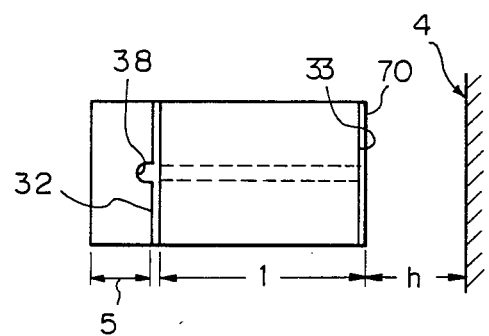
FIG. 12A shows another embodiment of the optical head according to the present invention.

In view of the interference in the gap spacing area, and equation (4), it is preferable that the reflection factor $R_L$ at the end of the laser facing the recording medium is as small as possible. Therefore, an anti-reflection film 70 is preferably attached on the end surface 33 which faces the recording medium 4, as shown in FIG. 12A. The anti-reflection film 70 is made of, for instance, a transparent dielectric material having a thickness of $\lambda/4n$ (where $\lambda$ is the wavelength, and n is the reaction index of the anti-reflection film). Other structures in FIG. 12A are the same as those with the same numerals as in FIG. 4.

Figure 12B:
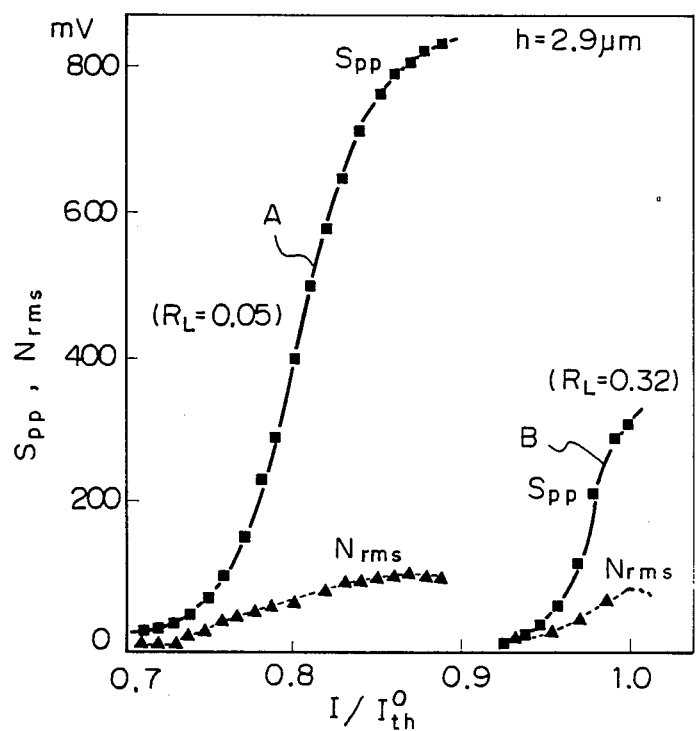
FIG. 12B shows the characteristic curves of the embodiment of FIG. 12A, FIGS. 13A and 13B show still another embodiment of the optical head according to the present invention.

FIG. 12B shows the effect of the anti-reflection film 70. The horizontal axis in FIG. 12B shows the signal optical output $S_{pp}(=P^H-P^L)$, and the noise optical output $N_{rms}$. The noise power $N_{rms}$ is the integral value of the noise component between 30 kHz and 20 MHz. The horizontal axis in FIG. 12B shows the normalized bias current I normalized by the threshold current $I_{th}^0$ which is the threshold current when no optical feedback light exists (no recording medium exists). The gap spacing length h in FIG. 12B is 2.9 μm, the reflection factor on the end surface 33 is 0.32 when no anti-reflection film 70 is provided, and 0.05 when the anti-reflection film 70 is provided. The curves A represents the case when the anti-reflection film is provided, and the curve B represents the case when no anti-reflection film is provided. It should be noted in FIG. 12B that when the anti-reflection film is provided, the desirable signal power $S_{pp}$ increases while the undesirable noise power $N_{rms}$ increases a little when the bias current increases, as compared with curve B where no anti-reflection film is provided. Therefore, the presence of the anti-reflection film increases the signal to noise ratio.

Next, some modifications which improve the spot size of a laser beam will be described below.

Figure 13A:
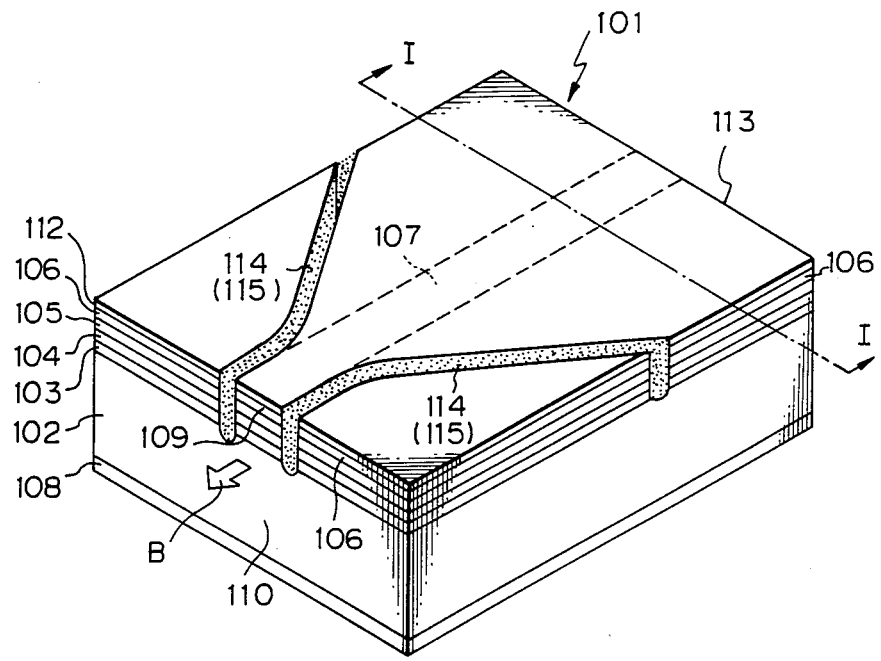
Figure 13B:
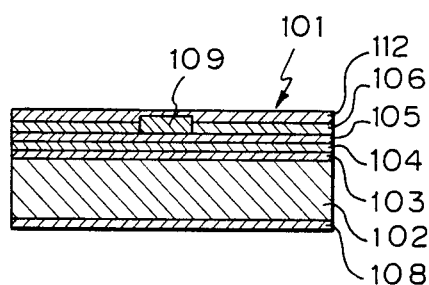

FIG. 13A shows the perspective view of another embodiment of the present optical head, and FIG. 13B is a cross sectional view along line I—I of FIG. 13A.

In those figures, the numeral 101 is a rectangular semiconductor laser, 102 is an N-type GaAs substrate, 103 is a lower clad layer which is an N-type GaAlAs deposited on the substrate 102. The numeral 104 is an active layer made of GaAlAs deposited on the lower clad layer 103. The numeral 105 is an upper clad layer made of a P-type GaAlAs deposited on the active layer 104, 106 is an insulation layer made of for instance SiO₂, 107 is a current concentration electrode having a uniform width, and extending between the front output end 110 and the rear output end 113. The electrode 107 is provided on the center line on the top of the semiconductor laser 101. The numeral 109 is a cap layer made of a GaAs deposited on the upper clad layer 105. The numeral 108 is an electrode attached on the bottom of the substrate 102, 112 is another electrode provided on the upper surface of the semiconductor laser 101. The numeral 114 is an essentially V-shaped insulation slit for sharpening the beam spot. The slit 114 is provided so that it contacts both sides of the current concentration electrode 107 and the front output end 110, and opens towards the sides or the back of the semiconductor laser 101. The slit 114 has enough depth (several μm) to reach the substrate 102. The slit 114 is produced, for instance, through a reactive ion beam etching process. Preferably, the slit 114 is filled with a filler which has a lower refractive index than that of the active layer 104. The filler 115 is made of, for instance, a photoresist painted on the surface of the slit, a SiO₂ film, a Si₃N₄ film, or a polyimide film.

The operation of the slit 114 and/or the filler 115 is to sharpen the beam spot, since the refractive index of the slit and the filler is much lower than the semiconductor laser material.

Figure 14:
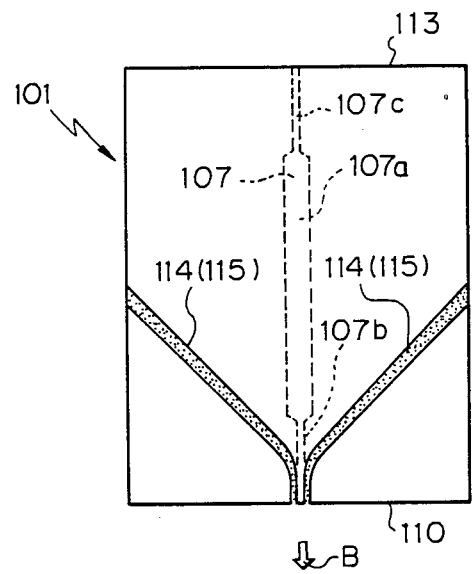
FIG. 14 shows the structure of a modification of FIGS. 13A and 13B, FIGS. 15A, 15B and 15C show the characteristics of the optical head of FIG. 14.

FIG. 14 shows a modification of FIG. 13. The feature of FIG. 14 is in the shape of the current concentration electrode 107. In FIG. 14, the current concentration electrode 14 is wider in a middle portion of the electrode, than at the end portions, and the width of the electrode changes stepwise. The length of the middle portion 107a of the electrode 107 occupies approximately ⅔ of the total length of the electrode 107. The insulation slit 114 is provided at the sides of the narrow portion 107b of the electrode 107. The same numerals in FIG. 14 show the same members as those in FIG. 13.

FIG. 15 shows the shape of a spot in the embodiment of FIG. 14.

FIG. 15A is a constant line of a bright optical spot at the front end of the semiconductor laser. It is noted that the spot is circular.

FIG. 15B shows the optical intensity of an optical spot in a horizontal direction to the active layer 104, and FIG. 15C shows the optical intensity of the optical spot in a vertical direction to the active layer 104.

Figure 16:
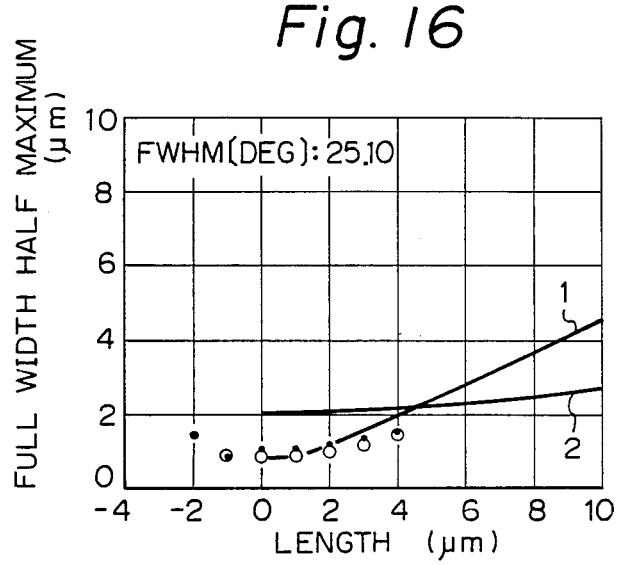
FIG. 16 shows the spot size by the optical head of FIG. 14.

FIG. 16 shows the diameter (Full Width Half Maximum) of an optical spot for the length from the front end of the laser of the embodiment of FIG. 14. The symbols in FIG. 16 are the same as those in FIG. 5.

The embodiment of FIG. 14 can also provide a small optical spot with a diameter about 1 $\mu$m, and further, it provides the essentially circular optical spot.

Figure 17:
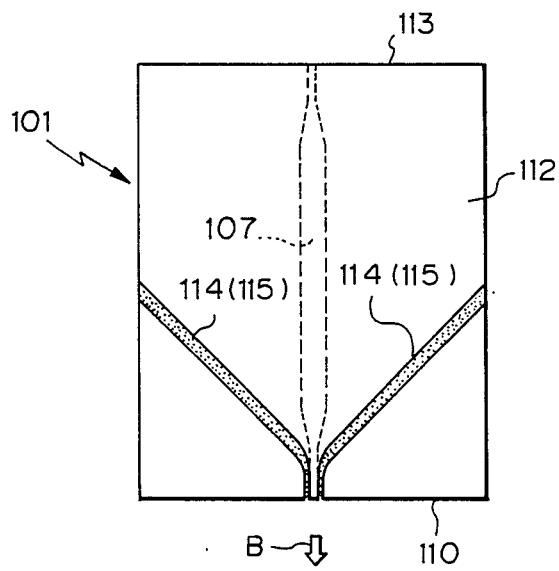
FIG. 17 is another modification of the optical head of FIG. 13.

FIG. 17 is a further modification of FIG. 14, and the feature of FIG. 17 is in the shape of the current concentration electrode 107. The current concentration electrode 107 in FIG. 17 is wider at a middle portion than at the end portions, as is FIG. 14. The coupling portion between the middle wide portion and the narrow end portions in FIG. 17 is not stepwise, but the width of that coupling portion changes gradually as shown in FIG. 17. The effect of the embodiment of FIG. 17 is essentially the same as that of FIG. 14, and the embodiment of FIG. 17 can provide the same small optical spot with a diameter of 1 $\mu$m. Further, the embodiment of FIG. 17 has the effect that the threshold current for stimulated emission of a laser is smaller than that of FIG. 14. The threshold current in FIG. 17 is about 70 mA, because of the gradually changing current concentration electrode.

Figure 18:
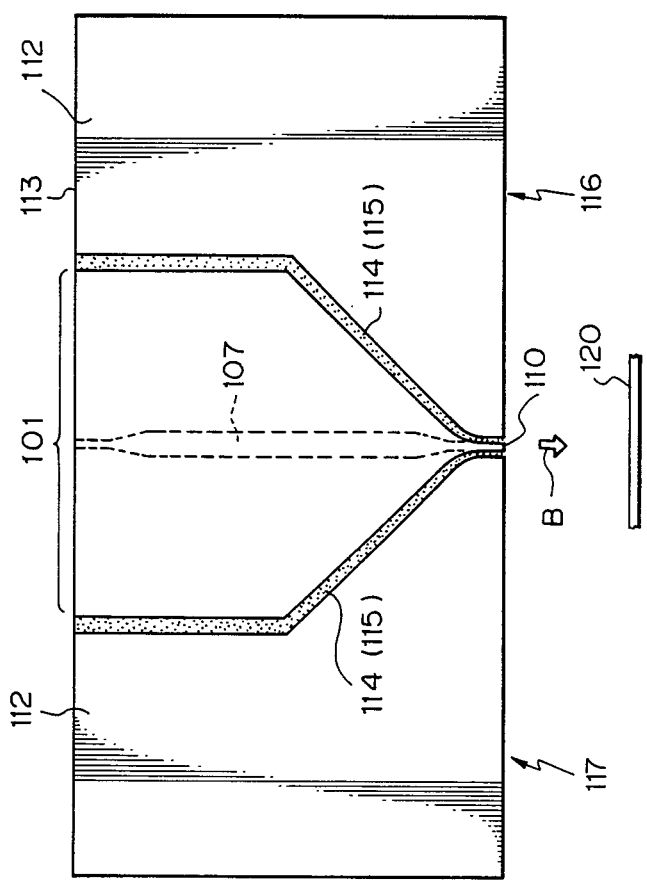
FIG. 18 is still another modification of the optical head of FIG. 13.

FIG. 18 is further modification of FIG. 17, and the feature of FIG. 18 is that not only a semiconductor laser 101 is provided, but also a pair of photodetectors 116 and 117 are mounted on a single common substrate. The laser 101 is separated from the photodetectors 116 and 117 by the insulation slit 114.

The current concentration electrode 107 in FIG. 18 may either be a gradually changing electrode as in FIG. 17, or a stepwise changing electrode as in FIG. 14. Alternatively, it may also be a uniform width electrode as in FIG. 12.

In the area of the photodetectors 116 and 117, the insulation layer 106 under the electrode 112 is replaced by a cap layer (109 in FIG. 12).

In operating the device of FIG. 18, the laser beam B emitted by the laser 101 is diffracted by the track groove on the recording medium 120, and the diffracted light is detected by the photodetectors 116 and 117.

The structure of FIG. 18 is applicable to the accurate tracking of an optical head. When the optical head is accurately positioned on a recording track, the light on the recording medium reflects or diffracts symmetrically, and the level of the first photodetector 116 is the same as the level of the second photodetector 117. On the other hand, when the optical head is shifted from the tracking position, the reflected (or diffracted) light is asymmetrical, and the level of the two photodetectors 116 and 117 differs from each other. Therefore, the accurate positioning of an optical head is effected by shifting the optical head so that the level of the two photodetectors is the same.

Next, another modification of the present optical head is described in accordance with FIGS. 19 through 23. The modification concerns the combination of an erase head (beam), a write head (beam), and/or a read head (beam) composed on a common substrate.

Figure 19:
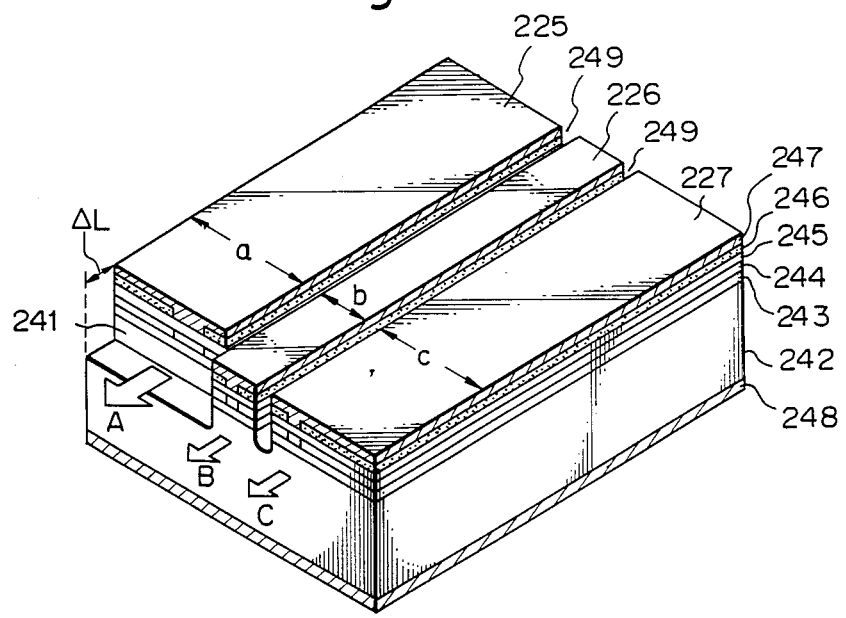
FIG. 19 shows the structure of still another embodiment of the optical head according to the present invention.

FIG. 19 shows the perspective view of the embodiment of the present optical head. In the figure, the numeral 242 is a semiconductor substrate made of an N-type GaAs, 243 is a lower clad layer made of an N-type GaAlAs, 244 is an active layer made of a GaAlAs, 245 is an upper clad layer made of a P-type GaAlAs, 246 is an insulation layer made of $SiO_2$, 247 is an electrode for applying electric current, 248 is a common electrode, 249 are slits which have enough depth to reach the substrate 242, and have the depth of about several $\mu$m.

The semiconductor substrate 242 mounts an erasing head 225, a write head 226, and a read head 227, and those heads 225, 226 and 227 are separated optically and electrically by the slits 249.

The insulation layer 246 has slits for coupling the electrode 247 with the active layer 244, in each portion 225, 226 and 227, so that the current is concentrated. The width (a) of the erase head portion is wider than width (b) of the write head portion 226, and width (c) of the read head portion 227.

Further, the optical output end 241 of the head portions is not in a single plane, but the output end of the erase head portion 225 is recessed or projected by the length $\Delta L$ as shown in the figure.

The optical head of FIG. 19 is produced as follows. On the substrate 242 made of an N-type GaAl, the lower clad layer 243, the active layer 244, the upper clad layer 245, and a cap layer (not shown) are produced by a liquid phase (or gaseous phase) epitaxial growth method. Then, the insulation layer 246, and the electrodes 247 and 248 are produced.

Next, a pair of parallel slits 249 are provided to separate the erase head portion, the write head portion, and the read head portion from one another. The slits have a width between several $\mu$m and 30 $\mu$m, and a depth of several $\mu$m so that the slits reach the substrate portion 242.

Further, the recess $\Delta L$ is provided by one of the following processes.

a) The focussing ion beam illuminates the portion where the recess is provided.

b) A proper mask material (for instance carbon), or an ion seed (for instance chlorine ion) which provides a small etching ratio for a GaAs semiconductor substrate is used.

c) The recessed or projected portion is ground by using a grinder of SiC with a thickness of several $\mu$m to 60 $\mu$m, and a diameter of several mm, in the flow of a liquid containing $SiO_2$.

Figure 20:
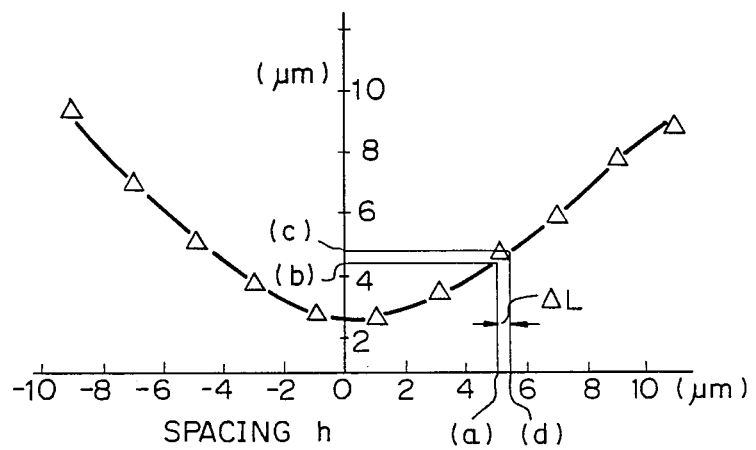
FIG. 20 shows the spot size of the optical head of FIG. 19.

The effect of the recess or projection $\Delta L$ is that the erase head provides a larger optical spot perpendicular to the track groove than the write head and the read head. FIG. 20 shows the relationship of the spacing h between the laser end and the recording medium, and the diameter of an optical spot. For instance, assuming that h=5 $\mu$m (a), the diameter of the spot perpendicular to the active layer is shown by (b). When the spacing is h+$\Delta L$ (d), the diameter of the spot is shown by (c), which is larger by about 10% when compared with (b).

Figure 21:
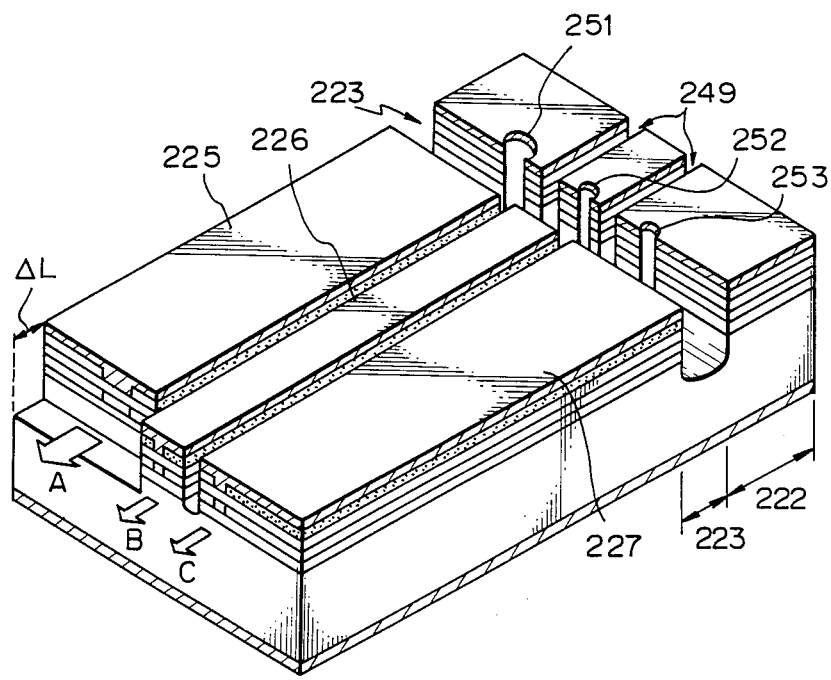
FIG. 21 is the modification of the optical head of FIG. 19.

FIG. 21 shows a modification of FIG. 19, and the feature of FIG. 21 is in combination of FIG. 19 with FIG. 4 which has a slit for separating a laser portion and a photodetector portion. In FIG. 21, the numeral 223 is a slit which separates the photodetector portion 222 which is mounted on the same substrate as that of the lasers. The numerals 225, 226 and 227 are an erase head, a write head, and a read head which are separated by a pair of slits 249, as in FIG. 19. Further, the recess ΔL is provided at the output end of the erase head, as in FIG. 19. The photodetectors 251, 252 and 253 are provided for an erase head portion, a write head portion, and a read head portion, respectively, for sensing the laser light of the erase head, the write head, and the read head.

Figure 22:
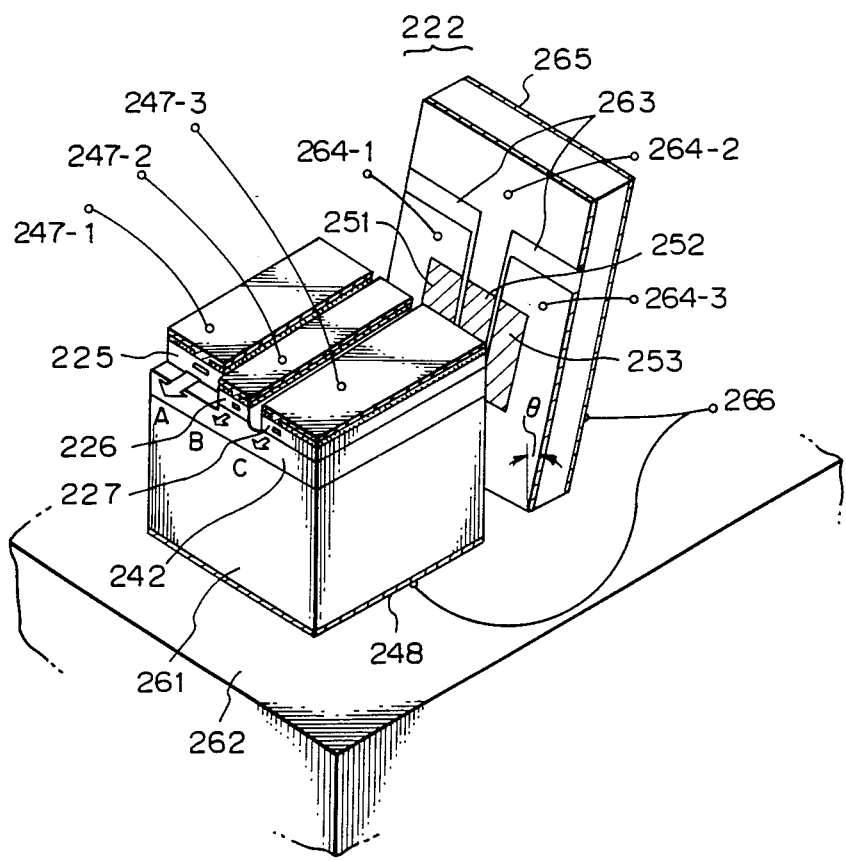
FIG. 22 is another modification of the optical head of FIG. 19.

FIG. 22 shows a further modification of FIG. 19, and the feature of FIG. 22 is in the separate photodetector 222, instead of a photodetector on the common substrate of FIG. 21. In FIG. 22, the numerals 225, 226 and 227 are an erase head, a write head, and a read head, respectively. The recess ΔL is also provided at the output end of the erase head. The numeral 242 is a semiconductor substrate, which is coupled with a heat sink 262 through a sub-block 261.

The photodetector 222 has three photosensors 251, 252 and 253, which are separated from one another by separation zones 263. The common electrode 265 of the photodetector is connected to the terminal 266, which is also connected to the common electrode 248 of the lasers. The numerals 247-1, 247-2 and 247-3 are electrode terminals for the semiconductor lasers, and 264-1, 264-2 and 264-3 are electrode terminals for the photodetectors. Preferably, the photodetector portion 222 is slanted by some angle θ, and/or an anti-reflection film is attached on the surface of the photosensors, so that reflected light by the photo sensors is not returned to the lasers.

The modification in FIG. 22, which has a separate photodetector portion, has the advantages that (1) a high power laser is obtained, since the rear output end of the laser can be produced through a cleaving process, and (2) the sensitivity of the photosensors may be high since the area of the sensors may be large.

Figure 23:
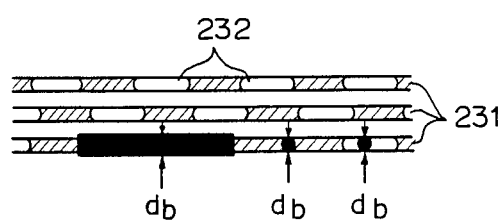
FIG. 23 shows the operation of the optical head of FIGS. 19, 21 and 22.

In operation of the embodiments of FIGS. 19 through 22, three laser beams illuminate a recording medium simultaneously, as shown in FIG. 23. Because of the presence of the recess ΔL, the width of the erase beam is wider than the width of the write beam and the read beam. Therefore, a pit recorded on a track is completely erased. The numeral 231 in FIG. 23 is a recording track, and 232 is a pit. The read head reads the data which is written by the write head, for confirming the current write operation.

Some modification and/or improvement of the optical head is of course possible to those skilled in the art. For instance, although the present specification describes a ridge type semiconductor laser in which the light output opening is defined by the power injection area, other types of lasers, for instance, a refractive guide laser (a buried semiconductor laser) can be used.

From the foregoing, it will now be apparent that a new and improved optical head has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An optical head comprising:
   a semiconductor laser having a first output end located close to an optical recording medium and a second output end facing an optical detector which detects an output intensity of said semiconductor laser, the output intensity of said semiconductor laser depending upon feedback light which is generated by the semiconductor laser and reflected by said optical recording medium, said semiconductor laser is biased so that a bias current of the semiconductor laser is lower than a first threshold current which stimulates the semiconductor laser to illuminate said recording medium on a first portion, said first portion having a first low reflection factor, and said bias current is higher than a second threshold current which stimulates the semiconductor laser to illuminate said recording medium on a second portion, said second portion having a higher reflection factor than that of said first portion.

2. An optical head according to claim 1, wherein a spacing between said first output end of the semiconductor laser and optical recording medium is determined so that light reflected by said optical recording medium and returned to said semiconductor laser is in phase with internal light in the semiconductor laser.

3. An optical head according to claim 1, wherein an anti-reflection film is coated at least on said first output end of the semiconductor laser.

4. An optical head according to claim 1, wherein said semiconductor laser includes a substrate, a first clad layer laminated on said substrate, an active layer located on top of said first clad layer, a second clad layer located on top of said active layer, an elongated current concentration electrode located on top of said second clad layer and extending between said output ends, and a pair of slits being provided between said output ends on lateral sides of said current concentration electrode, said pair of slits converging towards one side of the semiconductor laser and diverging on another side, and said slits having a depth reaching beyond said active layer.

5. An optical head according to claim 4, wherein said current concentration electrode has a non-uniform width in a direction between said first output end and said second output end so that the width of said electrode at output ends is narrower than that at a middle portion of the electrode.

6. An optical head according to claim 5, wherein said slits are filled with a dielectric material which has a refraction index lower than that of the clad layers and the active layer.

7. An optical head according to claim 6, wherein said slits are filled with one of $SiO_2$, $Si_3N_4$, and polyimid.

8. An optical head according to claim 1, wherein said semiconductor laser and said photo detector are mounted on a common semiconductor substrate, and are separated by a slit having a depth which reaches the substrate.

9. An optical head according to claim 9, wherein three semiconductor lasers are mounted on a single common semiconductor substrate for an erase head, a write head, and a read head, each head being separated from one another by a slit, and the first output end of the erase head facing the recording medium is in a different plane when compared with a plane of the output ends of the other heads.

10. An optical head according to claim 1, wherein three portions are mounted on a single common substrate, each portion being separated by slits, and a pair of outside portions are photo detectors for positioning a center portion on a track on the recording medium.

* * * * *